United States Patent
Wang

(10) Patent No.: US 11,822,173 B2
(45) Date of Patent: Nov. 21, 2023

(54) SUBSTRATE AND MANUFACTURING METHOD THEREOF AND DISPLAY PANEL

(71) Applicant: TCL China Star Optoelectronics Technology Co., Ltd., Guangdong (CN)

(72) Inventor: Hu Wang, Guangdong (CN)

(73) Assignee: TCL China Star Optoelectronics Technology Co., Ltd., Shenzhen (CN)

(*) Notice: Subject to any disclaimer, the term of this patent is extended or adjusted under 35 U.S.C. 154(b) by 620 days.

(21) Appl. No.: 16/976,768

(22) PCT Filed: Jul. 14, 2020

(86) PCT No.: PCT/CN2020/101822
§ 371 (c)(1),
(2) Date: Aug. 31, 2020

(87) PCT Pub. No.: WO2021/253547
PCT Pub. Date: Dec. 23, 2021

(65) Prior Publication Data
US 2023/0152617 A1     May 18, 2023

(30) Foreign Application Priority Data

Jun. 17, 2020   (CN) .......................... 202010552693.0

(51) Int. Cl.
| | | |
|---|---|---|
| G02F 1/1333 | (2006.01) |
| G02F 1/1362 | (2006.01) |
| G02F 1/1368 | (2006.01) |
| H01L 27/12 | (2006.01) |
| G02B 1/18 | (2015.01) |

(52) U.S. Cl.
CPC ......... *G02F 1/133354* (2021.01); *G02B 1/18* (2015.01); *G02F 1/1368* (2013.01); *G02F 1/13629* (2021.01); *G02F 1/133302* (2021.01); *G02F 1/133305* (2013.01); *H01L 27/1218* (2013.01); *H01L 27/1262* (2013.01); *G02F 2202/36* (2013.01)

(58) Field of Classification Search
CPC ......... G02F 1/133302; G02F 1/133305; H01L 27/1216; H01L 27/1262
See application file for complete search history.

(56) References Cited

U.S. PATENT DOCUMENTS

| | | | |
|---|---|---|---|
| 2006/0166411 A1* | 7/2006 | Morisue ............ H01L 27/14683 |
| | | | 438/149 |
| 2020/0194710 A1 | 6/2020 | Zhao et al. | |

FOREIGN PATENT DOCUMENTS

| | | |
|---|---|---|
| CN | 101440510 | 5/2009 |
| CN | 101956090 | 1/2011 |
| CN | 102002702 | 4/2011 |
| CN | 102052864 | 5/2011 |
| CN | 10-2012-0098089 | 9/2012 |
| CN | 102766893 | 11/2012 |

(Continued)

*Primary Examiner* — Mariceli Santiago

(57) ABSTRACT

A substrate, a method of manufacturing thereof, and a display panel are provided. The substrate includes a substrate layer and a super-hydrophobic layer. The substrate layer includes a first surface and a second surface disposed opposite the first surface. The super-hydrophobic layer is located on the first surface of the substrate layer. The super-hydrophobic layer is a porous metal film formed of a copper-zinc alloy.

17 Claims, 2 Drawing Sheets

(56) References Cited

FOREIGN PATENT DOCUMENTS

| | | |
|---|---|---|
| CN | 104157666 | 11/2014 |
| CN | 105568330 | 5/2016 |
| CN | 107346727 | 11/2017 |
| CN | 109860240 | 6/2019 |
| CN | 110038449 | 7/2019 |
| CN | 110854300 | 2/2020 |
| DE | 102009052302 | 5/2011 |

* cited by examiner

SUBSTRATE AND MANUFACTURING METHOD THEREOF AND DISPLAY PANEL

RELATED APPLICATIONS

This application is a National Phase of PCT Patent Application No. PCT/CN2020/101822 having International filing date of Jul. 14, 2020, which claims the benefit of priority of Chinese Patent Application No. 202010552693.0 filed on Jun. 17, 2020. The contents of the above applications are all incorporated by reference as if fully set forth herein in their entirety.

FIELD AND BACKGROUND OF THE INVENTION

The present disclosure relates to the technical field of a panel, and more particularly, to the technical field of a substrate and a manufacturing method thereof.

At present, electrodes in display panels usually use Cu instead of Al. Since Cu is more active, electrical performance of a Cu film substrate is often affected by surface corrosion during wet manufacturing processes, and many dots and stripes may be unevenly distributed throughout the entire substrate, resulting in poor product quality.

SUMMARY OF THE INVENTION

Technical Problems

The present disclosure provides a substrate to solve the corrosion problem of the substrate caused by the wet manufacturing processes and subsequent processes.

Technical Solutions

The present disclosure provides a substrate, and the substrate comprises:
  a substrate layer, comprising a first surface and a second surface disposed opposite the first surface; and
  a super-hydrophobic layer located on the first surface of the substrate layer. The super-hydrophobic layer is a porous metal film formed of a copper-zinc alloy. In the substrate provided by the present disclosure, an upper surface of the porous metal film has a micro-nano porous structure and a pore diameter of the micro-nano porous structure is from 50 nm to 3000 nm.

In the substrate provided by the present disclosure, a mass percentage of Zn in the copper-zinc alloy is from 1% to 30%.

In the substrate provided by the present disclosure, the copper-zinc alloy further comprises one of nickel and lead or a combination thereof.

In the substrate provided by the present disclosure, a contact angle between the super-hydrophobic layer and a droplet is greater than 150 degrees.

The present disclosure further provides a method of manufacturing a substrate, comprising:
  providing a substrate layer, wherein the substrate layer comprises a first surface and a second surface disposed opposite the first surface;
  depositing a copper-zinc alloy material on the first surface of the substrate layer;
  processing the copper-zinc alloy material to form a super-hydrophobic layer with a porous metal film; and
  washing the super-hydrophobic layer to obtain the substrate.

In the method of manufacturing the substrate provided by the present disclosure, the method further comprises a step of annealing the super-hydrophobic layer after the step of processing the copper-zinc alloy material to form the super-hydrophobic layer with the porous metal film.

In the method of manufacturing the substrate provided by the present disclosure, the annealing temperature is from 250 degrees Celsius to 1000 degrees Celsius.

In the method of manufacturing the substrate provided by the present disclosure, an etching solution is used to etch the upper surface of the copper-zinc alloy material, and the etching solution comprises $FeCl_3$.

In the method of manufacturing the substrate provided by the present disclosure, a mass percentage of $FeCl_3$ in the etching solution is from 5% to 20%.

In the method of manufacturing the substrate provided by the present disclosure, the etching solution further comprises a chelating agent, and the chelating agent is one of iminodiacetic acid, nitrilotriacetic acid, ethylenediamine tetramethylene phosphonic acid, maleic acid, amino trimethylene phosphonic acid, and amino trimethylene phosphonic acid or a combination thereof.

In the method of manufacturing the substrate provided by the present disclosure, the method further comprises a step of processing the super-hydrophobic layer with a stearic acid solution after the step of annealing the super-hydrophobic layer.

In the method of manufacturing the substrate provided by the present disclosure, the method further comprises a step of modifying the super-hydrophobic layer after the step of processing the super-hydrophobic layer with the stearic acid solution.

In the method of manufacturing the substrate provided by the present disclosure, the etching solution further comprises an inhibitor.

In the method of manufacturing the substrate provided by the present disclosure, the inhibitor is 5-aminotetrazolium.

The present disclosure further provides a display panel. The display panel comprises an array substrate, a liquid crystal layer, and a color filter substrate. The liquid crystal layer is disposed between the array substrate and the color filter substrate. The array substrate comprises:
  a substrate layer, which comprises a first surface and a second surface disposed opposite the first surface; and
  a super-hydrophobic layer located on the first surface of the substrate layer. The super-hydrophobic layer is a porous metal film formed of a copper-zinc alloy.

In the display panel provided by the present disclosure, an upper surface of the porous metal film has a micro-nano porous structure. A pore diameter of the micro-nano porous structure is from 50 nm to 3000 nm.

In the display panel provided by the present disclosure, a mass percentage of Zn in the copper-zinc alloy is from 1% to 30%.

In the display panel provided by the present disclosure, a contact angle between the super-hydrophobic layer and a droplet is greater than 150 degrees.

Beneficial Effects

The present disclosure provides a substrate, a method of manufacturing thereof, and a display panel. The substrate comprises a substrate layer and a super-hydrophobic layer. The substrate layer comprises a first surface and a second surface disposed opposite the first surface. The super-hydrophobic layer is a porous metal film formed of a copper-zinc alloy. In the present disclosure, the porous metal film formed of the copper-zinc alloy in the super-hydrophobic layer may increase the contact angle between the droplet and the super-hydrophobic layer and reduce the surface adhesion to avoid corrosion of the substrate, thereby improving the quality of the substrate.

BRIEF DESCRIPTION OF THE SEVERAL VIEWS OF THE DRAWINGS

The following detailed description of specific embodiments of the present disclosure in combination with the drawings will make the technical solutions and other beneficial effects of the present disclosure obvious.

DETAILED DESCRIPTION OF PREFERRED SPECIFIC EMBODIMENTS OF THE INVENTION

The technical solutions in the embodiments of the present disclosure will be described clearly and completely in combined with the drawings shown in the embodiments of the present disclosure. Obviously, the described embodiments are only one part of the embodiments of the present disclosure, but not all of the embodiments. Based on the embodiments of the present disclosure, all other embodiments obtained by a person skilled in the art without making creative efforts fall within the claim scope of the present disclosure.

Figure 1:
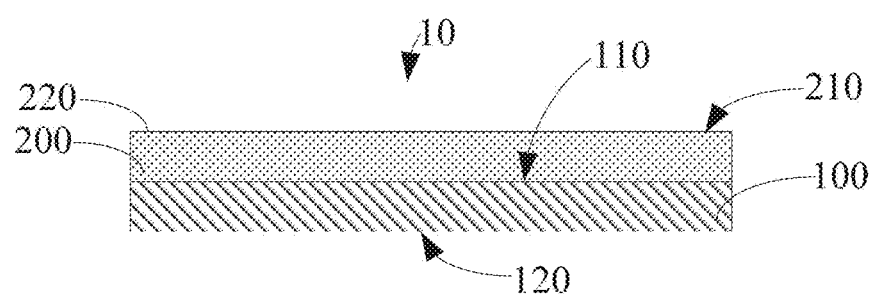
FIG. 1 is a schematic view of a substrate provided by the present disclosure.
Figure 2:
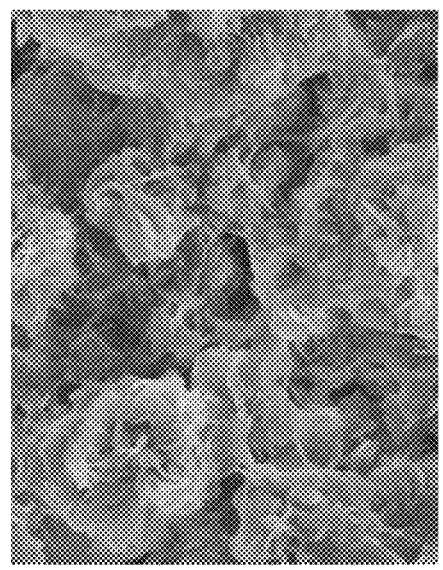
FIG. 2 is a scanning electron microscope picture of a super-hydrophobic layer provided by the present disclosure.

Please refer to FIG. 1 and FIG. 2. FIG. 1 is schematic view of a substrate provided by the present disclosure. FIG. 2 is a scanning electron microscope picture of a super-hydrophobic layer provided by the present disclosure. The present disclosure provides a substrate 10. The substrate 10 comprises a substrate layer 100 and a super-hydrophobic layer 200.

The substrate layer 100 comprises a first surface 110 and a second surface 120 opposite the first surface 110. A super-hydrophobic layer 200 is disposed on the first surface 110 of the substrate layer 100. The super-hydrophobic layer 200 is a porous metal film formed of a copper-zinc alloy. The upper surface 210 of the porous metal film 200 has a micro-nano porous structure 220. That is, the micro-nano porous structure 220 is a flocculent structure distributed densely as shown in in FIG. 2. The pore diameter of the micro-nano porous structure 220 is from 50 nm to 3000 nm. Specifically, in some embodiments, the pore diameter of the micro-nano porous structure 220 may be 100 nm, 1100 nm, 2000 nm or 2500 nm, etc. The material of the super-hydrophobic layer 200 is copper-zinc alloy. The mass percentage of Zn in the copper-zinc alloy material is from 1% to 30%. Specifically, in some embodiments, the mass percentage of Zn in the copper-zinc alloy material may be 3%, 8%, 19%, 25% or 28%, etc. When a droplet are present on the super-hydrophobic layer 200, since the super-hydrophobic layer 200 is a porous metal film formed of a copper-zinc alloy, the upper surface 210 of the porous metal film 200 has the micro-nano porous structure 220. It allows the droplet not to infiltrate the surface of the super-hydrophobic layer 200 to reduce the erosion of the surface of the super-hydrophobic layer 200 by the droplet. The droplet may be a water droplet, or a droplet formed of aqueous solutions such as salts, acids, or bases. In the present embodiment, the droplet is generated by the acidic substances decomposed during decontamination by extreme ultraviolet lithography or the residual acidic groups of the gas used in the wet manufacturing processes. A contact angle between the super-hydrophobic layer 200 and the droplet is greater than 150 degrees. Specifically, in some embodiments, the contact angle between the super-hydrophobic layer 200 and the droplet may be 157 degrees, 160 degrees, 172 degrees, or 178 degrees, etc.

In the present disclosure, the super-hydrophobic layer is a porous metal film formed of a copper-zinc alloy. The copper-zinc alloy material is cheaper than the pure copper material. The copper-zinc alloy used in the substrate may reduce the cost. The thermal expansion coefficient of the copper-zinc alloy is lower than the thermal expansion coefficient of the pure copper, which avoids warping during the subsequent heat treatment. The upper surface of the porous metal film has a micro-nano porous structure, thereby increasing the contact angle between the droplet and the super-hydrophobic layer, reducing the surface adhesion, reducing the corrosion problem of the substrate, and further enhancing the quality of the substrate.

In another embodiment, the copper-zinc alloy may further comprise nickel and/or lead.

In the present disclosure, adding nickel and/or lead to the copper-zinc alloy enhance the fineness of the crystal grains, which allows the micro-nano porous structure to be more uniform, thereby enhancing the hydrophobic effect of the super-hydrophobic layer.

Figure 3:
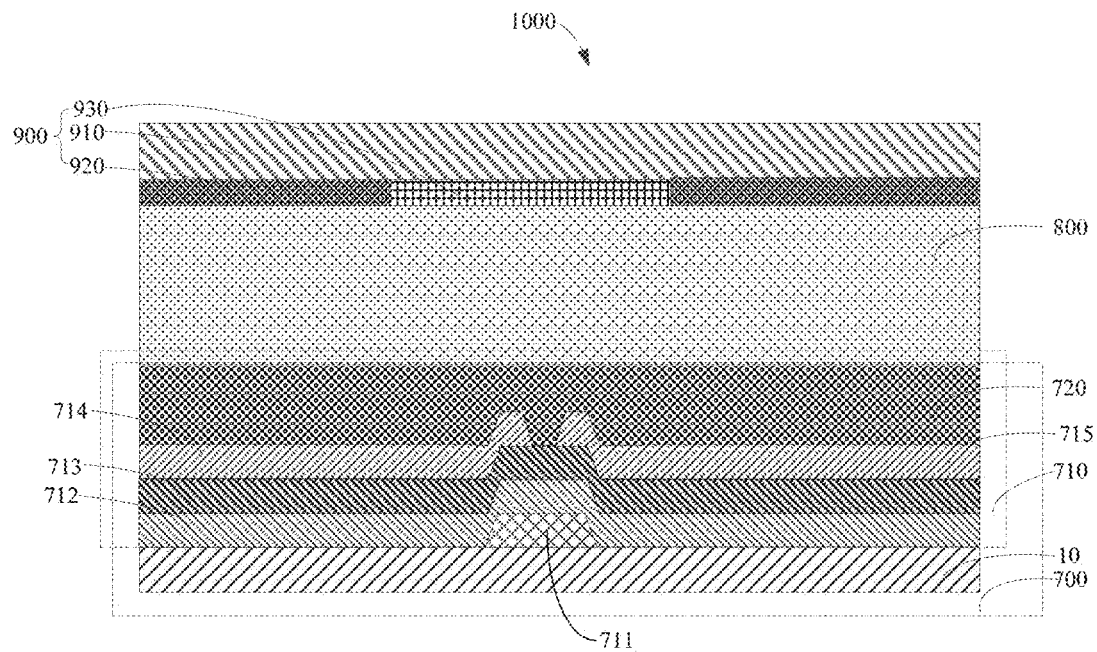
FIG. 3 is a structural cross-sectional view of a display panel provided by the present disclosure.

Please refer to FIG. 3. FIG. 3 is a structural cross-sectional view of a display panel provided by the present disclosure. The present disclosure further provides a display panel 1000. The display panel 1000 comprises an array substrate 700, a liquid crystal layer 800, and a color filter substrate 900. The liquid crystal layer 800 is disposed between the array substrate 700 and the color filter substrate 900.

Specifically, the array substrate 700 comprises a substrate 10, a thin film transistor 710, and a flat layer 720. The substrate 10 comprises the substrate 10 described above. That is, the substrate 10 comprises a substrate layer 100 and a super-hydrophobic layer 200, and a super-hydrophobic layer 200 is disposed on a first surface 110 of the substrate layer 100. The super-hydrophobic layer 200 is a porous metal film formed of a copper-zinc alloy. An upper surface 210 of the porous metal film 200 has a micro-nano porous structure 220. The thin film transistor 710 is disposed on the substrate 10. The flat layer 7200 is disposed on the thin film transistor 20. The thin film transistor 710 comprises a gate 711, a gate insulation layer 712, an active layer 713, a source 714, and a drain 715. The gate 711, the gate insulation layer 712, and the active layer 713 are stacked on the substrate 10 in sequence. The source 714 is disposed on one side of the active layer 713. The drain 715 is disposed on the other side of the active layer 713. The flat layer 720 covers the active layer 713, the source 714, and the drain 715. The color filter substrate 900 comprises an upper substrate 910, a black matrix layer 920 arranged on the upper substrate 910 in an array manner, and a color filter layer 930 disposed between the black matrix layers 920. The color filter layer 930 comprises one of a red color filter layer, a green color filter layer, and a blue color filter layer. The liquid crystal layer 800 is disposed between the array substrate 700 and the color filter substrate 900.

In the present disclosure, the substrate formed of the substrate layer and the super-hydrophobic layer is applied to the display panel. Since the super-hydrophobic layer is a porous metal film formed of a copper-zinc alloy, the upper surface of the porous metal film has the micro-nano porous structure. When the acidic substances and water generate the acidic solution or salt solution or alkali solution, the contact angle between the droplet and the super-hydrophobic layer may be increased as the droplet flows on the super-hydrophobic layer, thereby reducing the surface adhesion, reducing the corrosion problem of the substrate during the wet manufacturing processes or in the subsequent processes, further enhancing the yield of the substrate and thus enhancing the yield of the display panel.

Figure 4:
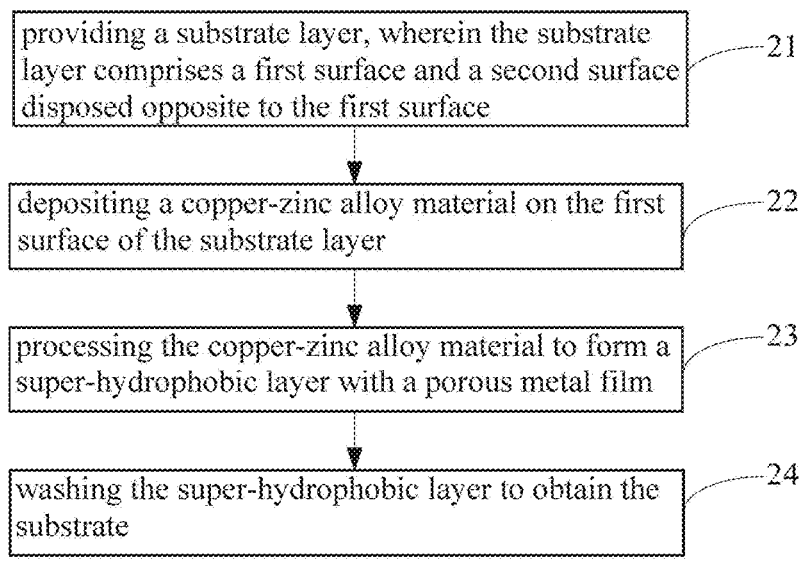
FIG. 4 is a flow chart of a method of manufacturing the substrate provided by the present disclosure.

Please refer to FIG. 4. FIG. 4 is a flow chart of a method of manufacturing the substrate provided by the present disclosure. The present disclosure further provides the method of manufacturing the substrate, which comprises:

a step of 21: providing a substrate layer 100, which comprises a first surface 110 and a second surface 120 disposed opposite the first surface 110.

Wash the substrate layer 100.

A step of 22: deposit a copper-zinc alloy material on the first surface 110 of the substrate layer 100.

Specifically, a physical vapor deposition method is used to deposit the copper-zinc alloy material on the substrate layer 100. A mass percentage of Zn in the copper-zinc alloy is from 1% to 30%.

A step of 23: process the copper-zinc alloy material to form a super-hydrophobic layer 200 with a porous metal film.

Specifically, the copper-zinc alloy material is subjected to surface treatment with an etching solution for 1 minute to 20 minutes to form the super-hydrophobic layer 200 with the porous metal film. Specifically, in some embodiments, the etching time is 2 minutes, 7 minutes, 16 minutes or 18 minutes, etc. The upper surface 210 of the porous metal film 200 has a micro-nano porous structure 220. That is, the micro-nano porous structure 220 is a flocculent structure distributed densely as shown in in FIG. 2. The pore diameter of the micro-nano porous structure 220 is from 50 nm to 3000 nm. Specifically, in some embodiments, the pore diameter of the micro-nano porous structure 220 may be 100 nm, 1100 nm, 2000 nm or 2500 nm, etc. The etching solution comprises $FeCl_3$. A mass percentage of $FeCl_3$ is from 5% to 20%. Specifically, in some embodiments, the mass percentage of $FeCl_3$ may be 6%, 10%, 15 or 18%, etc. When a droplet is present on the super-hydrophobic layer 200, since the super-hydrophobic layer 200 is a porous metal film formed of a copper-zinc alloy, the upper surface 210 of the porous metal film 200 has a micro-nano porous structure 220. It allows the droplet not to infiltrate the surface of the super-hydrophobic layer 200 to reduce the erosion of the surface of the super-hydrophobic layer 200 by the droplet. The droplet may be a water droplet, or a droplet formed of aqueous solutions such as salts, acids, or bases. In the present embodiment, the droplet is an acidic solution generated by the acidic substances and water. A contact angle between the super-hydrophobic layer 200 and the droplet is greater than 150 degrees. Specifically, in some embodiments, the contact angle between the super-hydrophobic layer 200 and the droplet may be 157 degrees, 160 degrees, 172 degrees, or 178 degrees, etc.

The principle of etching the super-hydrophobic layer with the porous metal film formed of a copper-zinc alloy is:

$$2FeCl_3+Zn=2FeCl_2+ZnCl_2 \quad (1)$$

$$2FeCl_3+Cu=2FeCl_2+CuCl_2 \quad (2)$$

Since Zn is more active than Cu, the reaction (1) occurs faster than the reaction (2) during the etching process, so that the super-hydrophobic layer forms the micro-nano porous structure, thereby increasing the surface roughness and forming a super-hydrophobic surface which has the contact angle greater than 150 degrees between the super-hydrophobic layer and the droplet.

In another embodiment, the etching solution further comprises a chelating agent and an inhibitor. The chelating agent comprises iminodiacetic acid, nitrilotriacetic acid, ethylenediamine tetramethylene phosphonic acid, maleic acid, amino trimethylene phosphonic acid, and amino trimethylene phosphonic acid. The inhibitor comprises 5-aminotetrazolium.

In another embodiment, after forming the super-hydrophobic layer 200, the super-hydrophobic layer 200 is annealed at 250 degrees Celsius to 1000 degrees Celsius for 10 minutes to 110 minutes. Specifically, in some embodiments, the annealing temperature may be 300 degrees Celsius, 500 degrees Celsius, 900 degrees Celsius or 970 degrees Celsius, etc. Specifically, in some embodiments, the annealing time may be 20 minutes, 83 minutes, 91 minutes or 105 minutes, etc.

In the present disclosure, annealing the super-hydrophobic layer may eliminate residual stress, stabilize the size of the micro-nano porous structure, and eliminate defects.

In another embodiment, after annealing the super-hydrophobic layer, the super-hydrophobic layer 200 is treated with a stearic acid solution.

In the present disclosure, the stearic acid solution treatment is performed to further modify the micro-nano porous structure of the surface, since stearic acid may react with the oxide on the surface of the super-hydrophobic layer to generate carboxylate.

In another embodiment, after treating the superhydrophobic layer with stearic acid, the surface of the super-hydrophobic layer 200 is modified. The modification treatment comprises acid solution treatment and alkaline solution treatment.

A step of 24: wash the super-hydrophobic layer 200 to obtain the substrate 10.

Specifically, ultrapure water is used to wash the metal salt solution generated by the reaction out of the superhydrophobic layer 200 to obtain the substrate 10.

In the present disclosure, the substrate formed of the substrate layer and the super-hydrophobic layer is applied to the display panel. Since the super-hydrophobic layer is the porous metal film formed of the copper-zinc alloy, the upper surface of the porous metal film has the micro-nano porous structure. When the acidic substances and water generate the acidic solution or salt solution or alkali solution, the contact angle between the droplet and the super-hydrophobic layer may be increased, thereby reducing the surface adhesion, reducing the corrosion problem of the substrate during the wet manufacturing processes or in the subsequent processes, and further enhancing the yield of the substrate.

The present disclosure provides the substrate and the method of manufacturing thereof and the display panel. The substrate comprises the substrate layer and the super-hydrophobic layer. The material for forming the super-hydrophobic layer is the copper-zinc alloy. The copper-zinc alloy material is cheaper than the pure copper material. Applying the copper-zinc alloy to the substrate may reduce the cost. The thermal expansion coefficient of copper-zinc alloy is lower than the thermal expansion coefficient of pure copper, which avoids warping in the subsequent heat treatment process. The upper surface of the super-hydrophobic layer is provided with the micro-nano porous structure further increases the contact angle between the droplet and the super-hydrophobic layer, thereby reducing the surface adhesion, reducing the corrosion problem of the substrate, further increasing the yield of the substrate, and thus increasing the yield of the display panel.

The above are only embodiments of the present disclosure and do not limit the scope of the present disclosure. Any equivalent structure or equivalent process transformation made using the description and drawings of the present disclosure, or directly or indirectly applied to other related technical fields, are within the scope of claimed invention of the present disclosure in the same reasons.

What is claimed is:

1. A substrate, characterized by comprising:
   a substrate layer, comprising a first surface and a second surface disposed opposite the first surface; and
   a super-hydrophobic layer located on the first surface of the substrate layer, wherein the super-hydrophobic layer is a porous metal film formed of a copper-zinc alloy,
   wherein the copper-zinc alloy further comprises one of nickel and lead or a combination thereof.

2. The substrate according to claim 1, characterized in that, wherein an upper surface of the porous metal film has a micro-nano porous structure, and wherein a pore diameter of the micro-nano porous structure is from 50 nm to 3000 nm.

3. The substrate according to claim 1, characterized in that, wherein a mass percentage of Zn in the copper-zinc alloy is from 1% to 30%.

4. The substrate according to claim 1, characterized in that, wherein a contact angle between the super-hydrophobic layer and a droplet is greater than 150 degrees.

5. A method of manufacturing a substrate, characterized by comprising:
   providing a substrate layer, wherein the substrate layer comprises a first surface and a second surface disposed opposite the first surface;
   depositing a copper-zinc alloy material on the first surface of the substrate layer;
   processing the copper-zinc alloy material to form a super-hydrophobic layer with a porous metal film; and
   washing the super-hydrophobic layer to obtain the substrate,
   wherein the method further comprises a step of annealing the super-hydrophobic layer after the step of processing the copper-zinc alloy material to form the super-hydrophobic layer with the porous metal film.

6. The method of manufacturing the substrate according to claim 5, characterized in that, wherein the annealing temperature is from 250 degrees Celsius to 1000 degrees Celsius.

7. The method of manufacturing the substrate according to claim 5, characterized in that, wherein an etching solution is used to etch the upper surface of the copper-zinc alloy material, and the etching solution comprises $FeCl_3$.

8. The method of manufacturing the substrate according to claim 7, characterized in that, wherein a mass percentage of $FeCl_3$ in the etching solution is from 5% to 20%.

9. The method of manufacturing the substrate according to claim 7, characterized in that, wherein the etching solution further comprises a chelating agent, and the chelating agent is one of iminodiacetic acid, nitrilotriacetic acid, ethylenediamine tetramethylene phosphonic acid, maleic acid, amino trimethylene phosphonic acid and amino trimethylene phosphonic acid or a combination thereof.

10. The method of manufacturing the substrate according to claim 7, characterized in that, wherein the method further comprises a step of processing the super-hydrophobic layer with a stearic acid solution after the step of annealing the super-hydrophobic layer.

11. The method of manufacturing the substrate according to claim 10, characterized in that, wherein the method further comprises a step of modifying the super-hydrophobic layer after the step of processing the super-hydrophobic layer with the stearic acid solution.

12. The method of manufacturing the substrate according to claim 7, characterized in that, wherein the etching solution further comprises an inhibitor.

13. The method of manufacturing the substrate according to claim 7, characterized in that, wherein the inhibitor is 5-aminotetrazolium.

14. A display panel, characterized by comprising an array substrate, a liquid crystal layer, and a color filter substrate, wherein the liquid crystal layer is disposed between the array substrate and the color filter substrate, and the array substrate comprises:
   a substrate layer, comprising a first surface and a second surface disposed opposite the first surface; and
   a super-hydrophobic layer located on the first surface of the substrate layer, wherein the super-hydrophobic layer is a porous metal film formed of a copper-zinc alloy,
   wherein the copper-zinc alloy further comprises one of nickel and lead or a combination thereof.

15. The display panel according to claim 14, characterized in that, wherein an upper surface of the porous metal film has a micro-nano porous structure, and wherein a pore diameter of the micro-nano porous structure is from 50 nm to 3000 nm.

16. The display panel according to claim 14, characterized in that, wherein a mass percentage of Zn in the copper-zinc alloy is from 1% to 30%.

17. The display panel according to claim 14, characterized in that, wherein a contact angle between the super-hydrophobic layer and a droplet is greater than 150 degrees.

* * * * *